July 15, 1969 J. J. FRANTZEN 3,455,751
PROCESS FOR MAKING PRINTED CIRCUITS AND THE LIKE BY STEP-BY-STEP ETCHING
Filed July 12, 1965

INVENTOR.
JOHN J. FRANTZEN
BY Stryker & Jacobson
ATTORNEYS

United States Patent Office 3,455,751
Patented July 15, 1969

3,455,751

PROCESS FOR MAKING PRINTED CIRCUITS AND THE LIKE BY STEP-BY-STEP ETCHING

John J. Frantzen, St. Paul, Minn., assignor to Buckbee-Mears Company, St. Paul, Minn., a corporation of Minnesota Filed July 12, 1965, Ser. No. 471,034
Int. Cl. C23f *1/02;* B44c *1/22*
U.S. Cl. 156—3 1 Claim

ABSTRACT OF THE DISCLOSURE

The conducting layer and the insulating layer of a conventional printed circuit board are made so that selected areas of both may be of reduced thickness by selectively controlling the degree of etching of each of the respective layers.

This invention relates generally to what is generically referred to as printed circuits and especially to printed circuits of the miniature and precision variety. More particularly, this invention is directed toward improvements in the process of making this type of circuit using etching techniques.

Briefly, the process of chemical etching printed circuits can be described as involving the steps of forming a pattern of the desired circuit on a suitable sheet or layer of conductive material, such as copper, and then etching away those areas of the conductive material which are not required to form the desired circuit pattern. In general, the sheet or layer of conductive material is bonded to a suitable supporting layer of insulating material. This in general is the type of circuit and the manner of producing those circuits with which the present invention is concerned.

For various reasons it is desirable and at times even necessary to completely remove portions of the supporting insulating layer which underlie and support the etched circuit pattern or at least partially remove prescribed areas of the insulation to varying degrees. In other words, it may be desirable to have an insulating layer which is partly removed as well as being of different thicknesses throughout its breadth. For example, it may be necessary to completely remove selected areas of insulating material in order to reduce the overall weight of the printed circuit or to make electrical connections through the circuit board from one side to the other or even to a different board in a multiple layer arrangement. Another case arises where the miniature precision printed circuit is initially formed on a flexible supporting layer, such as Mylar, and then is later wrapped or folded around a rigid supporting insulating board. A sharp bend in the flexible circuit could harmfully affect the conductive circuit itself either by placing such stress on the conductive layer in the area of the bend to cause it to rupture or possibly delaminating the conductive material from the insulating support layer. To prevent this, it is necessary to reduce the thickness of the insulating layer in the area of the sharp bends or folds. Typically, varied combinations are required in the construction of the circuit. Furthermore, these often must be incorporated into a double-sided printed circuit, that is one which contains a conducting circuit on both sides of the insulating layer.

It is the general object of this invention to provide a process for making miniature precision printed circuits using etching techniques in which the conductive material as well as the supporting insulating layer may be of various thicknesses over prescribed areas.

A further object of this invention is to provide a relatively economical process for achieving the foregoing object.

A more specific object of this invention is to provide an etching process for making printed circuits on flexible insulation so that the insulating layer can be bent severely without damaging the conducting circuit.

Still a more specific object of this invention is to provide a process for making a printed circuit on a suitable insulating layer on which prescribed areas of the insulating layer are completely removed and other areas may be partially removed by etching to predetermined thicknesses as desired.

A still further object of this invention is to provide a process for achieving the immediately foregoing object using photoprinting and etching techniques in which etchant resist material need be applied only once.

These and other objects and features of the invention will become apparent during the course of the following detailed description with reference to the accompanying drawings in which.

FIGS. 3A–G illustrate an end view of a circuit as it might appear during various stages of the process of this invention.

Figure 1:
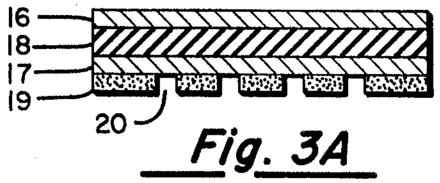
FIGURE 1 is an illustration of a circuit which might be constructed according to the teachings of this invention.
Figure 1:
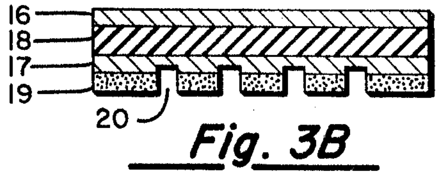
Figure 1:
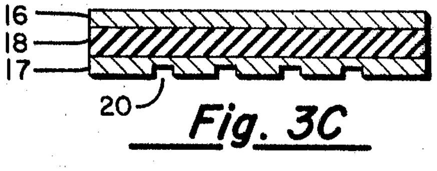
Figure 1:
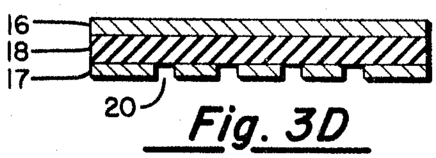
Figure 1:
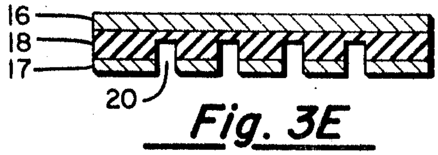
Figure 1:
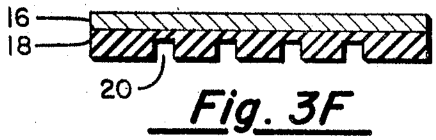
Figure 1:
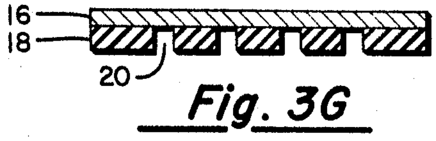
Figure 1:
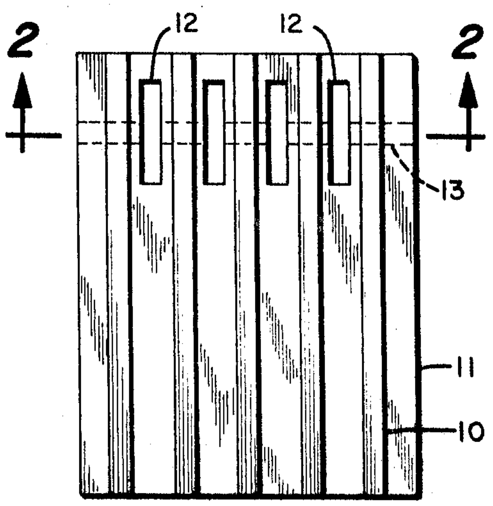
Figure 2:
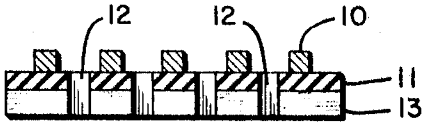
FIG. 2 is a sectional view of FIG. 1 as viewed along line 2—2.

To most clearly describe the present invention, it is appropriate to consider the various steps involved in the course of etching out an electric circuit such as depicted in FIGS. 1 and 2. The configuration of the illustrative circuit of FIG. 1 was chosen merely because it represents a construction which entails the various characteristics which are achievable with the present invention. The circuit contains a group of elongated, parallel, copper conducting strips 10 on a sheet 11 of relatively thin, flexible, insulating material such as Mylar. A group of four rectangular slits 12 or apertures pass completely through the Mylar sheet 11 between each pair of conducting lines 10. Transversing the sheet 11 is a groove or depression 13 which has its boundaries delineated by the dashed lines. In the area of this groove 13 the thickness of the insulating layer 11 has been substantially reduced, as is more apparent in FIG. 2. Typically, the reason for the groove 13 is to permit the sheet 11 to be folded back on itself 180° along the groove over the edge of a rigid supporting layer, not shown. In general, this is done to provide further support for the circuit for a variety of uses. When the circuit is folded along the fold line or groove 13, the copper strips 10 will not be unduly stretched or pulled away from the sheet 11.

FIGS. 3A–G serve to illustrate the steps involved in this invention for making a circuit similar to the one illustrated in FIGS. 1 and 2. The differences between the illustrations in FIG. 3 and the circuit of FIG. 1 will be explained and will also become apparent. However, the various steps which are illustrated in FIG. 3 should be followed in a similar manner, as described hereinafter, to construct the circuit of FIG. 1. FIG. 3 can be considered to be an end view of the circuit being formed, somewhat similar to the sectional view of FIG. 2.

In any well known manner, not considered part of the invention, there is provided a laminate comprising top and bottom layers, 16 and 17 respectively, of conducting material such as copper, sandwiching a layer of insulating material 18, such as Mylar, a trademarked product of Dupont Company. Typically the copper thickness may be in the order of .0007 inch and the Mylar may be in the order of .005 inch thick with the copper layers suitably bonded to the Mylar. In order to consider the invention in its proper environment so that the type of miniature circuit of concern can be visualized, it should be further pointed out that typically the slits 12 may be in the order of .020 x .010 inch and are spaced from the copper conductors 10 in the order of .010 inch and the copper conductors may be in the order of .002 inch wide. Covering the bottom layer of copper 17 is a coating of light-sensitive photo resist material which may be a suitable enamel well known in the art that is arranged in a pattern to define the desired circuit pattern. Preferably the photosensitive enamel is what is commonly referred to as "reverse" enamel wherein those areas of the enamel which are exposed to and struck by a suitable actinic light develop out and are readily removable as distinguished from "direct" enamel which hardens in those portions struck by light. Typically, the circuit-defining pattern of the enamel is formed by exposing the enamel coating to a suitable source of actinic light through a suitable mask so that light will strike the enamel only in the areas 20. The areas 20 designate the locations of the slits, such as 12 in FIG. 1, which are to be formed through the insulating layer 18. The enamel 19 is then readily removed from the areas 20 while it remains intact in the remaining areas.

In this condition the laminate is then subjected to etching which is accomplished in a well known manner. A chemical etchant for copper which is non-reactive with the resist 19 or the insulating layer 18 is applied to the bottom layer of copper 17 through the areas 20 which are void of enamel until the copper layer 17 it etched out in areas 20 to approximately one-half its thickness, such as illustrated in FIG. 3B. As the next step of the process the enamel resist 19 may be completely removed from the copper 17 as illustrated in 3C. However, where it is desired to reduce the thickness of the insulation 18 only in a certain prescribed area, such as the fold line or groove 13 in FIG. 1, the photo resist 19 will then be removed only from that corresponding area. Considering the latter to be the case, this can be done in a manner similar to that described earlier using the well-known photoprinting technique by now exposing the reverse enamel 19 to a suitable actinic light source through a suitable mask so that only those areas (such as 13) where it is desired to remove the enamel are struck by the light. Once again the enamel is then readily removed from these areas. When the resist 19 is removed, either completely as illustrated in FIG. 3C or over the prescribed area as described above, the copper etchant is once again applied for a period of time until the copper layer 17 is completely removed in the areas 20. In these areas which were not protected by the resist material 19, the copper etchant likewise etches away the copper down to a reduced thickness approximately one-half its original thickness. In other words, the newly etched areas of the copper layer 17, which may be the remainder of the layer or only a portion such as area 13, are reduced in thickness to the order of .00035 to .0004 inch and the copper has been completely removed from the areas 20. This is the condition illustrated in FIG. 3–D. As the next step in the process a chemical etchant which is suitable for etching the insulating layer 18 but is non-reactive with copper is then applied to the bottom side of the layer 18 through the open areas 20. Preferably the etchant for the Mylar comprises a solution which is applied in a manner as described in detail in Patent 3,186,883 titled Etching Polyester Film. As described in greater detail in the said patent, the solution contains a small percentage of water to control the etching rate. When applied in the manner described, the solution disintegrates or breaks down the portions of the Mylar film with which it makes contact so that these portions are readily removable by lixiviation leaving smooth relatively clean cut edge areas. As earlier stated, the application of water in controlled amounts acts to control the etching rate and in the present instance the rate is controlled so that the etching continues until the Mylar 18 is etched out to a small percentage of its original thickness in the areas 20. In the typical case the Mylar is reduced to .0006–.0007 inch. Since the chemical etchant for the Mylar is non-reactive with copper as shown in FIG. 3E, any remaining copper layer 17 acts as a protective mask over that surface area of the Mylar 18 which is not to be etched. It should be acknowledged, however, that in those areas where the copper is still coated by photo resist enamel 19 it has been found that in general the Mylar etchant also attacks and removes or substantially weakens the enamel although it is prevented from attacking the Mylar in these same areas because of the presence of the copper layer 17. Following this initial application of the etchant to the Mylar layer with accompanying removal of all resist, the etchant for copper is once again applied to layer 17. In the case where the entire remaining bottom layer of copper 17 had been previously etched down to about one-half thickness, at this time the entire copper layer 17 is removed exposing the entire underside of the Mylar layer 18. This is illustrated in FIG. 3F. In the case of earlier selective etching of the copper layer 17, e.g., reducing it to one-half thickness only in the fold area 13, during the present etching step the copper 17 will be completely removed from the latter area and will be reduced to approximately one-half thickness throughout the remainder so that only in the slit areas 20 and the groove area 13 will the Mylar be exposed. Once again etchant for the Mylar is applied in the same manner as described earlier and as explained in greater detail in Patent No. 3,186,883, until the areas 20 have been etched through completely to the underside of the top copper layer 16. Concurrently, of course, the etchant will attack the entire exposed undersurface of the Mylar layer 18 and will reduce the thickness of the Mylar in those areas to the desired degree which typically may be in the order of .0005–.0006 inch. Of course, if desired, the application of the etchant to the Mylar could be continued and the control maintained for a suitable period of time to reduce the thickness of the Mylar still further if desired. At this state the apertures or slits 12 in the areas 20 have been formed through the insulation layer and the fold line or groove 13 decreased thickness has also been formed if desired. The desired circuit patterns in the top layer of copper 16 can now be prepared in the usual manner using photoprinting and etching techniques. Of course, the circuit in the top layer could have been made earlier in the process. In those instances where it is desired to form double sided circuits, that is with copper conducting circuits on both sides of the insulating layer, the desired circuit can be etched out of the remaining bottom layer of copper 17 in the well-known manner even though it may be of reduced current carrying capacity due to reduced thickness. When designing the underside circuitry it is important that it be laid out so as not to interfere with the Mylar etching steps. This is a matter of design and use of correct layout techniques which is well known by those engaged in the field of designing printed circuits. In general it can be seen that by using the "reverse" enamel in the manner described, the time consuming steps of recoating the copper with protective resist enamel numerous times have been eliminated with a resulting substantial economic benefit. It can also be seen that in the process as described, initially the enamel resist provides the masking for etching the desired pattern through the copper and in subsequent steps the copper serves as a mask for selectively etching through and into the Mylar. Projecting the teachings of this invention to some variations, it can be visualized that the process can be used to selectively etch the conducting layers and the insulating layers to different degrees of thickness and in a variety of patterns as desired for a variety of purposes. As a further step in the process, if circuitry is to be etched out of the remaining bottom layer of copper 17 after the slits through the insulating layer 18 have been formed, it is preferable to fill the slit areas 20 with some type of protective material so that the chemical etchant which is applied to the bottom layer of copper 17 does not attack the top layer of copper 16 through these openings.

The following is a variation of the process described hereinabove. In this variation the bottom layer of copper 17 is coated with a very thin flashing of another metal such as nickel except for those areas corresponding to the fold line area 13 and the slit areas 12. This can be done in the following manner: First, the entire surface of the bottom layer copper 17 is coated in the usual manner with a suitable light sensitive photo resist enamel. By the well known photoprinting techniques, the enamel is then exposed through a suitable mask to a suitable source of actinic light so that the enamel is readily removed from all of the areas except those corresponding to areas 12 and 13. A thin covering of nickel is then flashed onto the copper, to a thickness of approximately .0005 inch, where the copper is not protected by resist enamel. In the next step the copper layer 17 is partially etched away in those areas corresponding to the slits 12. This is done preferably by first removing all of the remaining enamel that still protects portions of the copper 17, then recoating the entire area, including the nickel covered portions, with enamel and then exposing once again through a suitable mask in the usual manner so that the enamel is removed only from areas 12. The chemical etchant for the copper is then applied for a sufficient duration to etch approximately half way through the copper layer 17 in areas 12. Following this, the enamel is then removed by photoprinting from the areas corresponding to the fold line area 13 and again the copper etchant is applied. This time the etch is continued until the copper is etched completely through in the slit areas 12 and approximately half way through in the fold line area 13. The remaining steps are similar to those described earlier, that is, the Mylar is first etched a substantial amount through at the slit areas 12; following this is removal by etching of the reduced thickness copper in the fold line area 13; and following this by again applying the etchant for the Mylar until the Mylar is etched completely through in the slit areas 12 and to the desired thickness in the fold line area 13. In this variation it is the flash coating of nickel which effectively acts as the protective shield when selectively etching through the insulating Mylar and the bottom layer copper. As in the earlier described process, thereafter the copper circuitry can be formed in the well-known manner.

I claim:

1. The method of removing material in selected areas from double sided printed circuits and the like comprising the steps of:

(a) providing a sheet of insulating material having a layer of conductive material on opposite sides suitable for forming a double sided printed circuit;

(b) coating one of the conductive layers of material with a resist material in a form suitable for making a circuit defining pattern;

(c) etching first selected portions of said conductive layer that are not coated with said resist material;

(d) removing said resist material coating on second selected portions of said circuit defining pattern;

(e) etching said conductive material on said first selected portion and said second selected portion until said first selected portions are etched completely through and said second selected portions are etched partially through;

(f) etching said insulating material completely through on said first selected portions; and (g) etching said second selected portions so as to create a groove suitable for bending said double printed circuit along.

References Cited

UNITED STATES PATENTS

| | | | |
|---|---|---|---|
| 3,186,883 | 6/1965 | Frantzen | 156—7 |
| 3,346,415 | 10/1967 | Hachenberger | 117—212 |

JACOB H. STEINBERG, Primary Examiner

U.S. Cl. X.R.

156—11, 2; 174—68.5